United States Patent [19]

Kato et al.

[11] Patent Number: 4,864,246

[45] Date of Patent: Sep. 5, 1989

[54] MOBILE AUTOMATIC VOLUME CONTROL APPARATUS

[75] Inventors: Masayuki Kato; Shinjiro Kato; Fumio Tamura, all of Saitama, Japan

[73] Assignee: Pioneer Electronic Corporation, Tokyo, Japan

[21] Appl. No.: 242,256

[22] Filed: Sep. 9, 1988

[30] Foreign Application Priority Data

Nov. 25, 1987 [JP] Japan .............................. 62-295288
Nov. 25, 1987 [JP] Japan .............................. 62-295289
Jun. 17, 1988 [JP] Japan .............................. 63-148295

[51] Int. Cl.$^4$ .............................................. H03G 3/30
[52] U.S. Cl. ...................................... 330/129; 330/136; 330/149; 330/281; 381/107; 455/238; 455/244
[58] Field of Search ............... 330/127, 129, 136, 141, 330/149, 281; 455/238, 244; 381/86, 94, 107

[56] References Cited

U.S. PATENT DOCUMENTS 4,179,667 12/1979 Bottcher ........................ 330/141 X
4,644,292 2/1987 Kunugi et al. .................. 330/149 X

FOREIGN PATENT DOCUMENTS

0026929A1 4/1981 European Pat. Off. .
2435956A1 2/1976 Fed. Rep. of Germany .
2522381A1 12/1976 Fed. Rep. of Germany .
2934593A1 2/1980 Fed. Rep. of Germany .
2928616A1 1/1981 Fed. Rep. of Germany .
2942331A1 5/1981 Fed. Rep. of Germany .
2529727A1 1/1984 France .
2579842A1 10/1986 France .
616033A5 2/1980 Switzerland .
2179807A 4/1987 United Kingdom .

OTHER PUBLICATIONS

German Search Report, #P38 30 423.6 dated Dec. 12, 1988.
Patents Abstracts of Japan, E-237, Apr. 10, 1984–vol. 8/No. 78.

Primary Examiner—James B. Mullins
Attorney, Agent, or Firm—Sughrue, Mion, Zinn, Macpeak & Seas

[57] ABSTRACT

An automatic volume control apparatus for use in a mobile audio apparatus in which a detection output from a noise detection section is compared with a control output applied to a volume control section, and a capacitor inserted between a control signal input terminal of the volume control section and a reference voltage point is charged/discharged by a current source section with a constant current on the basis of the output of the comparator to thereby make it possible to make the change of volume constant or linear relative to the change of noise level. Also, a control signal for a volume controller is obtained by subtracting a quantity of logarithmic change of an audio signal detection signal obtained from an audio signal detection section relative to a reference value from a value obtained by amplifying, with an amplification factor in a range of 1.5 to 2.5, a quantity of logarithmic change of a noise detection signal obtained from a noise detection section relative to a reference value, whereby the correspondence between levels of low-frequency components of, for example, 10 Hz or less and audible frequency components of in-vehicle noise becomes higher so that it is possible to perform more natural volume control.

13 Claims, 4 Drawing Sheets

MOBILE AUTOMATIC VOLUME CONTROL APPARATUS

BACKGROUND OF THE INVENTION

The present invention relates to an automatic volume control apparatus, called, for example, an ASL (automatic sound levelizer), for use in a mobile audio apparatus.

A mobile audio apparatus often suffers from ambient noise problems from, for example, engine noise and road noise generated between the tires and road surface. The reproduced sound from the apparatus suffers from a masking effect due to such noise. Accordingly, it is necessary to perform volume control corresponding to the level of noise.

FIG. 1 is a diagram illustrating a conventional mobile automatic volume control apparatus. In FIG. 1, reference numeral 1 represents a signal line receiving an audio signal, 2 designates a sound volume control section receiving the audio signal as an input thereto, 3 is a power amplifier for power-amplifying the output of the volume control section 2, and 4 represents a speaker for converting the output from the power amplifier 3 into an audio signal. Reference numeral 5 indicates a microphone for detecting background noise, 6 is a noise detection section receiving the output of the microphone 5 as an input thereto, 7 represents a diode with its cathode and anode connected to the output of the noise detection section 6 and a control signal input of the volume control section 2, respectively, 8 designates a resistor connected to the diode 7 in parallel thereto, and 9 is a capacitor 9 connected between the control signal input of the volume control section 2 and a reference potential point (ground).

In the above-described arrangement, the audio signal received on the signal line 1 is volume-controlled in the volume control section 2, power-amplified by the power amplifier 3, and then reproduced as sound rom the speaker 4. If the amplification factor of the volume control section 2 were controlled directly according to a noise voltage obtained from the microphone 5, the resulting extreme variations in volume would be annoying. To avoid this problem, a time constant is provided by a low-pass filter constituted by the resistor 8 and the capacitor 9 so that a more gently varying voltage produced across the capacitor 9 is employed for the control voltage for the volume control section 2. However, the time constant provided by the filter constituted by the resistor 8 and the capacitor 9 has the same characteristic for both noise level increases and decreases.

Since the perceived abnormality in sound volume can be reduced if the time constant for noise level decreases is made shorter than that in the case of noise level increase, a diode 7 is connected in parallel with the resistor 8 as shown in FIG. 1. (In this circuit, it is assumed that the output voltage of the noise detection section 6 rises as the noise level increases.)

The diode 7 is reversely biased when the output of the noise detection section 6 is rising so that no current flows through diode 7. The time constant when the noise level is rising therefore depends on the component values of the resistor 8 and capacitor 9. When the noise level is falling, the diode 7 is forwardly biased so that the equivalent resistance value of the resistor 8 is reduced. Therefore, the time constant when the noise level is falling is shorter than when the noise level is rising.

In the prior art arrangement shown in FIG. 1, the volume rises gently when the noise level is rising but quickly when the noise level is falling. The time constant, however, depends on resistance and capacitance values, while the voltage applied to the volume control section 2 as a control signal changes along an exponential curve. Although there is no large sense of abnormality within a region of small noise level changes, when a large noise level change occurs, for example, in the case of a sudden stop, there is a remarkable difference in the rate of change in volume between the initiation and in the termination of the change in volume so that significant sense of abnormality occurs. That is, for a noise level decrease, the terminal voltage of the capacitor 9 is discharged through the low impedance of the diode in its on-state. When the noise level drops, however, the current through the diode 7 decreases as the terminal voltage of the capacitor 9 approaches the noise voltage at that point of time, causing the impedance across the diode 7 to decrease. If this occurs at the same time that the control signal is changing along the final portions of the exponential curve, the perceived abnormality in the sound level change is remarkable.

FIG. 2 is a diagram illustrating another example of a conventional mobile automatic volume control apparatus. In FIG. 2, reference numeral 101 represents a microphone 101 for detecting the ambient noise level, and 102 is a noise detection section 102 constituted by an amplifier for amplifying the output of the microphone 101, a low-pass filter for extracting a low-band component from the output of the amplifier, a detector for AM-detecting the output of the filter, and related components.

The cutoff frequency of the low-pass filter in the noise detection section 102 is set at about 10 Hz taking into consideration the spectrum of the audio signal and the vibration frequency of a typical vehicle engine. (For example, the vibration frequency is about 27 Hz in the case of a four-cycle, four-cylinder engine at an idling speed of 800 rpm.)

Reference numeral 103 designates an audio signal input terminal to which a reproduction output from a tuner, tape deck or the like is applied. The reproduction output is applied to an audio signal detection section 104. The audio signal detection section 104, constituted by an envelope detector, detects the input level of the audio signal applied to the input terminal 103.

The outputs of the noise detection section 102 and the audio signal detection section 104 are respectively applied to logarithmic amplifiers 105 and 106 having the same characteristic, and then applied to a subtractor 107 after being compressed logarithmically by the logarithmic amplifiers 105 and 106. Thus, the subtractor 107 receives noise detection information from the logarithmic amplifier 105 as a positive input and audio signal detection information from the logarithmic amplifier 106 as a negative input. The differential output of the subtractor 107 is applied to a volume controller 108 as a control signal. The volume controller 108 is constituted by a variable gain amplifier. The signal applied to the audio signal input terminal 103 is applied to a control input of the volume controller 108, whereby the level of the audio signal is controlled according to the output of the subtractor 107. The audio signal having a level controlled by the volume controller 108 is supplied to an output terminal 109, amplified by a main amplifier (not shown), and reproduced by a speaker. The volume controller 108 responds to a linear increase/decrease of the control signal applied to its control input so as to increase/decrease the gain logarithmically in accordance with the ambient noise level.

Being arranged as described above and operating on the assumption that all ambient noise is confined in frequency below 10 Hz, this conventional automatic volume control apparatus has had a problem in that it is impossible to deal with variations in audible frequency components of noise occurring upon changes in vehicle speed. That is, in actual use, volume control is carried out primarily in response to changes in audio level rather than noise.

SUMMARY OF THE INVENTION

It is therefore an object of the present invention to eliminate the disadvantages in the above-described prior art apparatus shown in FIG. 1.

It is another object of the present invention to provide a mobile automatic volume control apparatus in which the disadvantages in the prior art caused by the exponential curve due to RC time constants is eliminated so as to make it possible to effect volume control with less perceived abnormality.

In order to attain the foregoing objects, according to the present invention, a mobile automatic volume control apparatus is provided comprising: a noise detection section for detecting ambient noise and for generating a detection output corresponding to the noise level; a time constant circuit responsive to the detection output of the noise detection section for generating a control output; and a volume control section receiving an audio signal for controlling the output level of the audio signal in response to the control output of the time constant circuit received at a control signal input terminal thereof; in which the time constant circuit includes a comparator for comparing the detection output of the noise detection section with the control output applied to the volume control section, and a current source section controlled by the output of the comparator to cause a capacitor coupled between the control signal input terminal of the volume control section and a reference voltage point to be charged/discharged at a constant rate.

In the above arrangement, the comparator compares the detection output supplied by the noise detection section with the control output applied to the volume control section, and the current source section operates on the basis of the output of the comparator so that the capacitor coupled between the control signal input terminal of the volume control section and the reference voltage point is charged or discharged with a constant current so as to make the change of volume constant or linear relative to changes in the noise level.

It is a further object of the present invention to eliminate the disadvantages of the apparatus of FIG. 2.

It is a still further object of the present invention to provide a mobile automatic volume control apparatus in which correspondence between the level of audible frequency components of in-vehicle noise and the level of frequency components of 10 Hz or less detected by a low-pass filter is improved to make it possible to perform more natural volume control.

In order to attain the latter objects, in a mobile automatic volume control apparatus according to the present invention, a control signal supplied to a volume controller constituted by a variable gain amplifier is produced by subtracting a quantity of logarithmic change of an audio signal detection signal obtained from an audio signal detection section relative to a reference value from a value obtained by amplifying, with an amplification factor in a range of 1.5 to 2.5 inclusive, a quantity of logarithmic change of a noise detection signal obtained from a noise detection section relative to a reference value.

BRIEF DESCRIPTION OF THE DRAWINGS

Other features and advantages of the present invention will be apparent from the following description taken in connection with the accompanying drawings, wherein.

DESCRIPTION OF THE PREFERRED EMBODIMENTS

Figure 1:
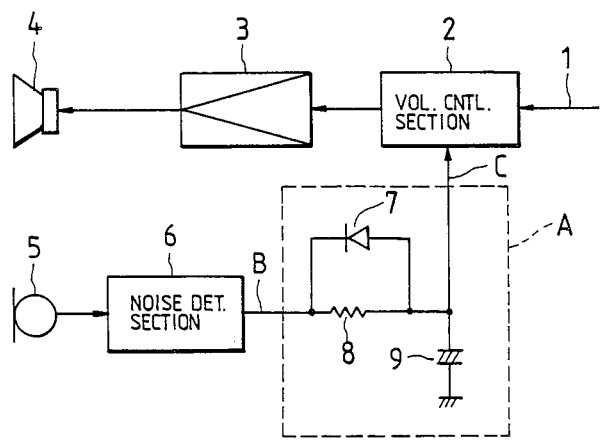
FIG. 1 is a block diagram illustrating an example of a volume control apparatus of the prior art.
Figure 3:
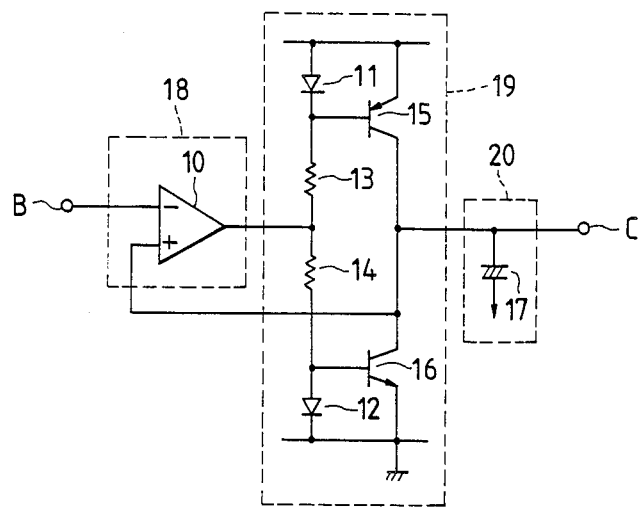
FIG. 3 is a circuit diagram illustrating a main part of a first embodiment of the present invention.

FIG. 3 is a diagram illustrating a first embodiment of the present invention, particularly showing only a part corresponding to the time constant circuit A constituted by the diode 7, resistor 8 and capacitor 9 in the prior art arrangement of FIG. 1. That is, terminals B and C are connected to the output of the noise detection section 6 and the control signal input of the volume control section 2 shown in FIG. 1.

The embodiment of FIG. 3 is constituted basically by a comparison section 18, a current source section 19 and a control voltage generating section 20. The comparison section 18 is constituted by a comparator 10 having a negative input receiving a detection output from the noise detection section 6 of FIG..1 and a positive input receiving a control voltage, namely, the control signal input C of the volume control section 2 of FIG. 1. The output of the comparator 10 is connected to the current source section 19. The current source section 19 includes a diode 11 with its anode connected to a power source line, a resistor 13 having one end connected to the cathode of the diode 11, and a resistor 14 having one end connected to the other end of the resistor 13 and its other end connected to the anode of a diode 12, the cathode of the latter being connected to ground. The output of the comparator 10 is connected to a junction point between the resistors 13 and 14. The current source section 19 further includes a PNP transistor 15 and an NPN transistor 16. The PNP transistor 15 has its emitter connected to the power source line, base connected to the junction point between the diode 11 and the resistor 13, and collector connected to the positive input of the comparator 10. The collector of the NPN transistor 16 is connected to the positive input of the comparator 10, its base is connected to the junction point between the resistor 14 and the diode. 12, and its emitter is connected to a reference potential point. The control voltage generating section 20 is constituted by a capacitor 17 connected between a reference potential point, for example, a middle potential point, and a connection point between the collectors of the transistors 15 and 16. The terminal voltage $V_{cc}$ of the capacitor 17 is used as a volume control voltage.

In the above arrangement, the noise detection output (the potential at the point B) becomes higher than the middle potential when the noise level increases. The control voltage (the potential at the point C) becomes higher than the middle potential at that time.

The noise detection output and the control voltage are represented by; $V_b$ and $V_c$, respectively. It is assumed that the voltages $V_b$ and $V_c$ are at a substantially constant value, and that the noise level begins to rise so that the noise detection voltage $V_b$ becomes high. At that time, $V_b > V_c$, in which case the output of the comparator 10 assumes a negative maximum amplitude, that is, about 0 V. At that time, the anode of the diode 12 also becomes 0 V so that the diode 12 is in the off state. No voltage then is present across the diode 12. The transistor 16 with its base connected to the anode of the diode 12 is therefore cut off so that the collector level of the transistor 16 has no influence on the control voltage $V_c$. On the other hand, voltage drops are generated across the resistor 13 and across the diode 11 because one end of the resistor 13 becomes 0 V and the other end is connected to the power source line through the diode 11. Assume now that the power source voltage of the power source line is $V_{cc}$, that the forward voltage drop across the diode 11 is 0.6 V, and that the resistance value of the resistor 13 is $R_R$. Then the current $I_R$ flowing through the diode 11 and the resistor 13 is expressed by, $$I_R \approx (V_{cc} - 0.6)/R_R \quad (1)$$

If the transistor 15 has a base-emitter voltage the same as the forward voltage drop across the diode 11 and a characteristic the same as the diode 11, the current flowing through the transistor 15 is equal to the current flowing through the diode 11. Since the transistor 16 is in the off state as described above, the collector current of the transistor 15 flows into the capacitor 17. Thus, the voltage across the capacitor 17 increases at a constant rising rate expressed by:

$$dV/dt = I_R/C \quad (2)$$

because $i \cdot t = C \cdot V$. The potential across the capacitor 17 is equal to the voltage $V_c$. If the voltage $V_c$ rises beyond the voltage $V_b$, the output of the comparator 10 reverses state so that the voltage $V_c$ stops rising. That is, the voltage $V_c$ increases at a constant rate independently of the rate of rise of the voltage $V_b$ before the voltage $V_c$ becomes equal to the voltage $V_b$.

On the contrary, in the case where the voltage $V_b$ falls below the voltage $V_c$, the transistor 15 is cut off and the transistor 16 is turned on. Therefore, assuming that the resistance value of the resistor 14 is $R_F$, a current $I_F$ expressed by the following equation flows through the resistor 14 and the diode 12 from the comparator 10, as a result of which the voltage $V_c$ falls at a constant rate until the voltage $V_c$ becomes equal to the voltage $V_b$, that is, $V_c = V_b$.

$$I_F \approx (V_{cc} - 0.6)/R \quad (3)$$

As has been described above, in the embodiment shown in FIG. 3, a charge circuit for the capacitor 17 is formed by a first constant current circuit constituted by the transistor 15, the diode 11 and the resistor 13, and a discharge circuit for the capacitor 17 is formed by a second constant current circuit constituted by the transistor 16, the diode 12 and the resistor 14. The charge and discharge operations of the charge and discharge circuits are controlled by the output from the comparator 10, and the magnitudes of the charge and discharge currents are determined by the ratio of the resistance value of the resistor 13 to that of the resistor 14.

With this embodiment of the invention, for both increases and decreases in the ambient noise level, the control voltage changes at a constant rate independently of the change of noise level. As has been described above, it is known that the perceived abnormality in the sound level is small if the time constant when the noise level drops is made shorter than for when the noise level increases. It has been confirmed that with the embodiment of FIG. 3 good results can be obtained by selecting the above-mentioned ratio to be 100 or more, that is, by making the ratio $R_R/R_F \geqq 100$, where $R_R$ and $R_F$ represent the resistance values of the resistors 13 and 14, respectively.

Figure 4:
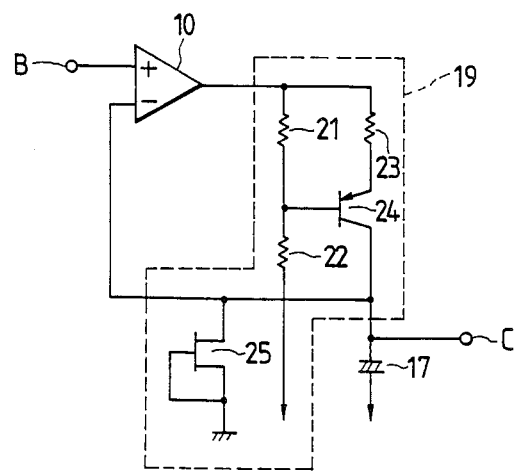
FIG. 4 is a circuit diagram illustrating a main part of a second embodiment of the present invention.

FIG. 4 is a diagram illustrating a second embodiment of the present invention. In this embodiment, charge and discharge operations for a capacitor are achieved by a combination of a constant current source controlled by a comparator and a normally operating constant current source.

That is, the embodiment of FIG. 4 differs from the embodiment of FIG. 3 only in the current source section 19 in which resistors 21 to 23 and a transistor 24 constitute the current source controlled by the comparator 10, and an FET 25 constitutes the normally operating current source.

The operation of the embodiment of FIG. 4 will be described under the assumption that both the noise detection output $V_b$ and the control voltage $V_c$ fall when the noise level rises.

First, in the case of an increase in the noise level, the output of the comparator 10 becomes zero since $V_b < V_c$, the transistor 24 is cut off because its base and emitter are equal in potential. The capacitor 17 is therefore discharged through the constant current source constituted by the FET 25 to thereby lower the voltage $V_c$, that is, the terminal voltage of the capacitor 17 until the voltage $V_c$ becomes equal to the voltage $V_b$, that is $V_b = V_c$.

When the noise level decreases, on the contrary, the voltage $V_b$ rises above the voltage $V_c$, that is, $V_b > V_c$, and hence the output of the comparator 10 becomes $V_{cc}$. The capacitor 17 is therefore charged through the collector of the transistor 24 with a constant current corresponding to the voltage across the base and emitter of the transistor 24, which is determined by the values of the resistors 21 to 23. This charge is held before the voltage $V_c$ becomes equal to $V_b$, that is, $V_c = V_b$.

At that point, the collector current $I_F$ of the transistor 24 is expressed by:

$$I_F = [R_{21}/(R_{21} + R_{22}) \times V_{cc} - 0.6]/R_{23} \quad (4)$$

Accordingly, in order to make the current value $I_F$ 100 or more times as large as the constant current from the FET 25, it suffices to properly select the resistance values $R_{21}$ to $R_{23}$ on the basis of the above equation (4).

As has been described above, since a voltage having a constant rate of change, that is, a linearly changing voltage generated when a capacitor is charged/discharged with a constant current, is used as a control voltage, the change of controlled volume is smooth and the operation produces a superior sound effect.

In the above-described first embodiment, a charging current source is actuated to charge a capacitor when the noise level rises, and a voltage which is produced across the capacitor and which rises at a constant gradient is used as the volume control voltage so that the volume rises at a constant rate. Further, when the noise level drops, a discharge current source is actuated to discharge the capacitor in such a manner that the voltage across the capacitor falls at a constant gradient. If the ratio between the two gradients is set to make the rate of volume decrease in the presence of a falling noise level sufficiently high, that is, the current value of the current source used in the case of a noise level drop is 100 or more times as large as that employed when the noise level increases, the speed of volume decrease in the presence of a falling noise level is made much higher than the speed of volume increase when the noise level rises. Thus, the volume level change substantially follows the noise detection signal when the noise level drops while the volume changes at a constant rate independently of the speed at which the noise level increases.

As explained above, it is preferable to make the rate of change of volume large when the noise level drops; otherwise a large volume will remain large creating a "booming" sensation, even if the noise stops entirely, such as in the case of sudden braking or the like.

If the ratio of the rising volume gradient to the falling volume gradient is set at 100:1 or more, the volume will quickly drop when the noise level drops. However, if the noise detection signal falls momentarily such as during a brief respite in an otherwise constant level of noise, if the ratio is set at 100:1 or more as described above, the volume will nevertheless fall in response to the detection signal, and it takes a long time to recover the initial volume level appropriate for the noise level. In order to substantially eliminate this phenomenon as well as to cause the volume to drop sufficiently quickly when the noise level actually does decrease for a substantial period, it has been confirmed by experiments that it is preferable to set the above-mentioned ratio at 10:1 or more.

Although a capacitor is charged during time of noise level increase and discharged when the noise level falls to generate the volume control voltage in the above-discussed first embodiment, it should be understood the charging and discharging can be reversed, that is, the capacitor may be discharged when the noise level rises and charged when the noise level drops to generate the volume control voltage, as in the case of the second embodiment shown in FIG. 4.

As has been described above, according to the present invention, it has been confirmed experimentally during field tests that volume changes occurring upon noise level increase and decrease are greatly improved in comparison with the conventional apparatus in which volume is changed in accordance with an experimental characteristic. It has been simultaneously confirmed that it is preferable to make a charge/discharge current when the noise level drops 100 or more times, more preferably 10 or more times, as large as that when the noise level increases. It is possible to easily establish this ratio according to the present invention.

Figure 5:
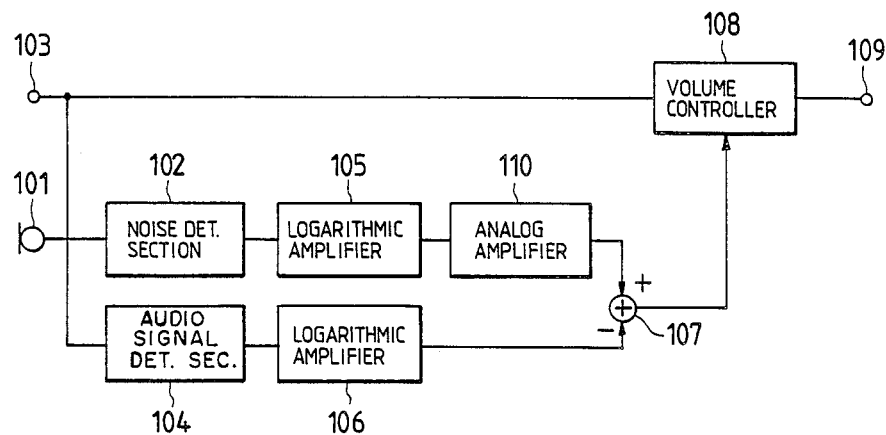
FIG. 5 is a block diagram illustrating a third embodiment of the present invention.

FIG. 5 is a block diagram illustrating a third embodiment of the present invention. A further detailed description of parts represented by the reference numerals 101 to 109 in FIG. 5 will be omitted since they are the same as those shown in FIG. 2.

In the embodiment of FIG. 5, an analog amplifier 110 is provided which receives the output of a logarithmic amplifier 105 and amplifies the latter with an amplification factor in a range of 1.5 to 2.5 inclusive.

Figure 6:
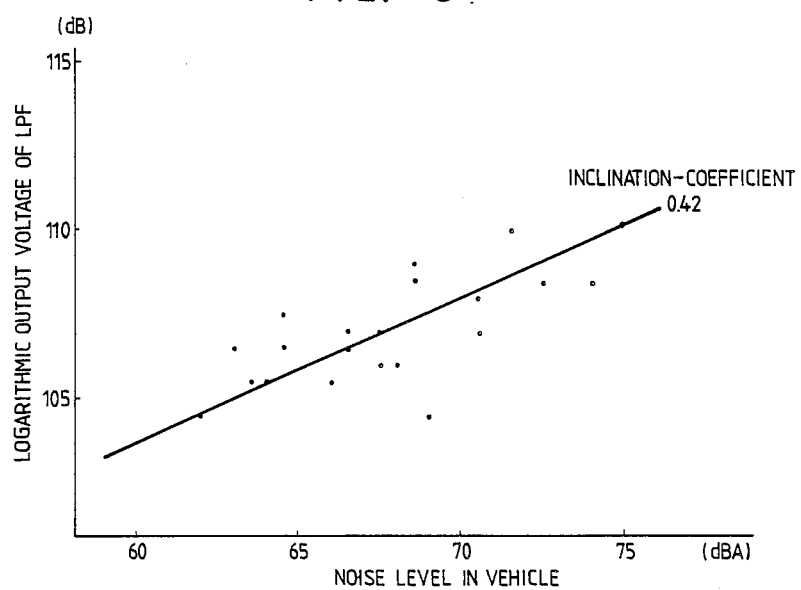
FIGS. 6 and 7 are graphs showing the correlation between a level of ambient in-vehicle noise and a noise detection output.
Figure 7:
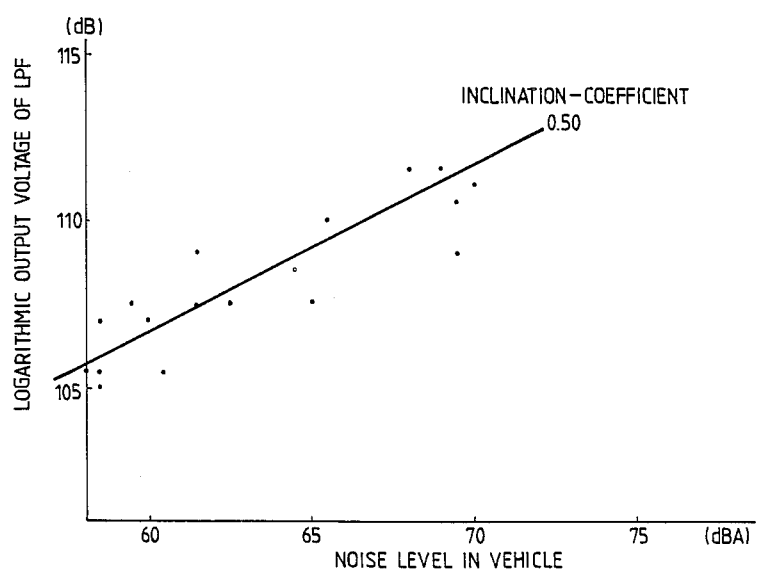

The arrangement shown in FIG. 5 is established on the basis of measurement results presented in FIGS. 6 and 7. In each of FIGS. 6 and 7, where the abscissa represents the noise level in a vehicle and the ordinate the logarithmic output voltage of a low-pass filter having a cut-off frequency of 10 Hz in a noise detection section 102, there is shown the A-weighted level (dB A) of the in-vehicle noise level and the logarithmic output voltage (relative value) of the low-pass filter in the noise detection section 102 at corresponding times. FIGS. 6 and 7 show the measured values with respect to two different car models "C" and "M" made by the same automobile manufacturer. From the measured values, it can be seen that the inclination coefficient is about 0.42 for car C and about 0.50 for car M. That is, it has been found that the ratio of the quantity of change of noise after logarithmic compression to the quantity of change of the output voltage of the low-pass filter in the noise detection section after logarithmic compression is about 2:1. Accordingly, it is possible to obtain a preferable result if the ratio is controlled to be approximately 2:1, that is, it should be in a range of about 1.5:1 to 2.5:1. .

For the reasons described above, it is possible to improve the correspondence between the level of audible frequency components of in-vehicle noise and the level of the noise detection signal by inserting the analog amplifier 110 having an amplification factor in a range of 1.5 to 2.5 inclusive in the succeeding stage of the logarithmic amplifier 105 in the case where the cut-off frequency of the low-pass filter in the noise detection section is selected to be about 10 Hz.

Thus, it is possible to provide a volume controller which properly responds to the rate of change of the level of audible frequency components of in-vehicle noise.

Figure 2:
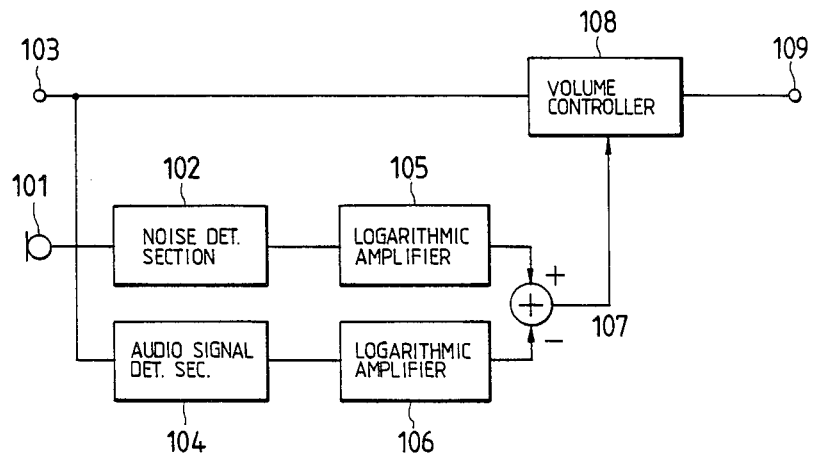
FIG. 2 is a block diagram illustrating another example of the prior art.
Figure 8:
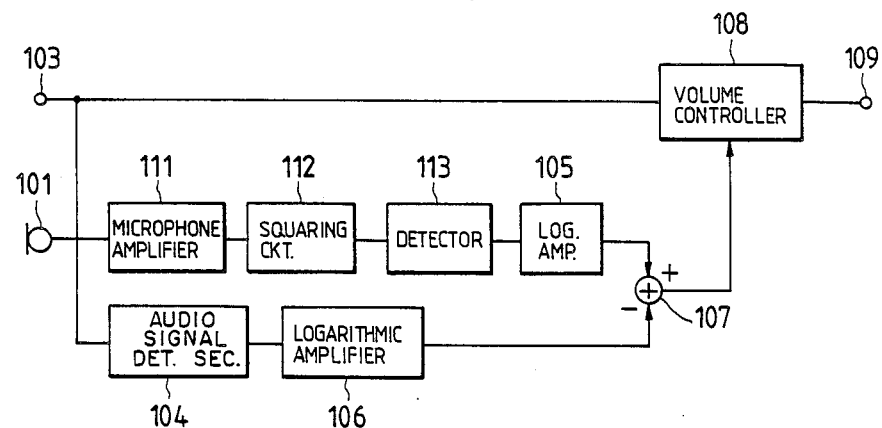
FIG. 8 is a block diagram illustrating a fourth embodiment of the present invention.

FIG. 8 is a diagram illustrating a fourth embodiment of the present invention, where parts represented by reference numerals 101 and 103 to 109 are the same as those shown in FIGS. 2 and 5.

In the embodiment of FIG. 8, there are provided a microphone amplifier 111 for amplifying the output of a microphone 101 so as to obtain the output through a low-pass filter contained within microphone amplifier 111, a squaring circuit 112 for squaring the output of the microphone amplifier 111, and a detector 113 for detecting the output of the squaring circuit 112, the detection output of the detector 113 being applied to the analog amplifier 105.

The case where the squaring circuit 112 is inserted between the microphone amplifier 111 and the detector 113 as shown in FIG. 8 is represented by the equation:

$$\log(A^2) = 2 \cdot \log A$$

also possible in this case to obtain an operative effect equivalent to that in the case of FIG. 5.

As is apparent from the above description, according to the present invention, the reproduced volume (dB) is made twice as large as in the conventional case for the same rate of change of frequency components of 10 Hz or less of in-vehicle noise, so that the correspondence between the level of the frequency components of 10 Hz or less and the level of audible frequency components of in-vehicle noise become higher, making it possible to obtain a natural volume control effect suitable for both the level of noise and the desired reproduced sound level.

What is claimed is:

1. A mobile automatic volume control apparatus comprising:
    means for producing a signal corresponding to ambient noise;
    a noise detection section for detecting an ambient noise level comprising a low-pass filter having a cut-off frequency of substantially 10 Hertz for extracting low-frequency components from said signal corresponding to ambient noise;
    an audio signal detection section receiving an audio signal for detecting an input level of said audio signal;
    means for producing a control signal by subtracting a quantity of logarithmic change of an audio signal detection signal obtained from said audio signal detection section relative to a reference value from a value obtained by amplifying, with an amplification factor in a range of from 1.5 to 2.5 inclusive, a quantity of logarithmic change of a noise detection signal obtained from said noise detection section relative to a reference value; and
    a volume controller for increasing/decreasing an output level of said audio signal in response to said control signal.

2. The mobile automatic volume control apparatus according to claim 8, in which said means for producing said control signal comprises a first logarithmic amplifier for logarithmically compressing an output of said noise detection section, and an analog amplifier for amplifying an output of said first logarithmic amplifier with an amplification factor of 1.5 to 2.5, and a second logarithmic amplifier for logarithmically compressing an output of said audio signal detection section, said control signal being obtained by subtracting an output component of said second logarithmic amplifier from an output component of said analog amplifier.

3. The mobile automatic volume control apparatus according to claim 1, in which said means for producing said control signal comprises a squaring circuit for squaring an output of said noise detection section, a first logarithmic amplifier for logarithmically compressing an output of said squaring circuit, and a second logarithmic amplifier for logarithmically compressing an output of said audio signal detection section, said control signal being obtained by subtracting an output component of said second logarithmic amplifier from an output component of said first logarithmic amplifier.

4. A mobile automatic volume control apparatus comprising:
    a noise detection section for detecting an ambient noise level and producing a detection output corresponding to the detected noise level;
    a time constant circuit responsive to said detection output of said noise detection section for generating a volume control output;
    a volume control section receiving an audio signal for controlling an output level of said audio signal in response to said control output of said time constant circuit received at a control signal input terminal of said volume control section;
    a capacitor coupled between said control signal input terminal of said volume control section and a reference voltage point;
    said time constant circuit comprising a comparator for comparing said detection output of said noise detection section with said control output applied to said volume control section, and a current source section comprising a voltage divider having a first and a second resistor, a first constant current circuit for charging/discharging said capacitor and including said first resistor, and a second constant current circuit for discharging/charging said capacitor and including said second resistor, said comparator having an output connected to a connection point between said first and second resistors so that said capacitor is charge/discharged at a constant rate.

5. The mobile automatic volume control apparatus according to claim 4, wherein the ratio of the resistance value of the first resistor to the resistance value of the second resistor is greater than or equal to 10:1.

6. The mobile automatic volume control apparatus according to claim 4, wherein the ratio of the resistance value of the first resistor to the resistance value of the second resistor is greater than or equal to 100:1.

7. The mobile automatic volume control apparatus according to claim 11, in which said current source section comprises means for charging/discharging said capacitor in response to a noise decrease with a larger current than for a noise level increase.

8. The mobile automatic volume control apparatus according to claim 7, in which a charge/discharge current for a noise level decrease is 100 or more times as large as a charge/discharge current for a noise level increase.

9. The mobile automatic volume control apparatus according to claim 7, in which a charge/discharge current for a noise level decrease is 10 or more times as large as a charge/discharge current for a noise level increase.

10. A mobile automatic volume control apparatus comprising:
    a noise detection section for detecting an ambient noise level and producing a detection output corresponding to the detected noise level;
    a time constant circuit responsive to said detection output of said noise detection section for generating a volume control output;
    a volume control section receiving an audio signal for controlling an output level of said audio signal in response to said control output of said time constant circuit received at a control signal input terminal of said volume control section;
    a capacitor coupled between said control signal input terminal of said volume control section and a reference voltage point;
    said time constant circuit comprising a comparator for comparing said detection output of said noise detection section with said control output applied to said volume control section, and a current source section comprising a first constant current circuit controlled by an output of said comparator for charging/discharging said capacitor at a constant rate and a second constant current circuit (25) which is not controlled by said output of the comparator for continuously discharging/charging said capacitor at a constant rate.

11. The mobile automatic volume control apparatus according to claim 10, in which said current source section comprises means for charging/discharging said capacitor in response to a noise decrease with a larger current than for a noise level increase.

12. The mobile automatic volume control apparatus according to claim 11, in which a charge/discharge current for a noise level decrease is 100 or more times as large as a charge/discharge current for a noise level increase.

13. The mobile automatic volume control apparatus according to claim 11, in which a charge/discharge current for a noise level decrease is 10 or more times as large as a charge/discharge current for a noise level increase.

* * * * *